US012731646B2

(12) United States Patent
Wang et al.

(10) Patent No.: US 12,731,646 B2
(45) Date of Patent: Sep. 8, 2026

(54) SPLIT-GATE MEMORY ARRAY AND METHOD FOR OPERATING SAME

(71) Applicant: SHANGHAI HUAHONG GRACE SEMICONDUCTOR MANUFACTURING CORPORATION, Shanghai (CN)

(72) Inventors: Ning Wang, Shanghai (CN); Kegang Zhang, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 107 days.

(21) Appl. No.: 18/865,444

(22) PCT Filed: Aug. 9, 2023

(86) PCT No.: PCT/CN2023/111900
§ 371 (c)(1),
(2) Date: Nov. 13, 2024

(87) PCT Pub. No.: WO2024/152551
PCT Pub. Date: Jul. 25, 2024

(65) Prior Publication Data

US 2025/0356923 A1 Nov. 20, 2025

(30) Foreign Application Priority Data

Jan. 16, 2023 (CN) ......................... 202310073534.6

(51) Int. Cl.
*G11C 16/04* (2006.01)
*G11C 16/10* (2006.01)
*G11C 16/30* (2006.01)

(52) U.S. Cl.
CPC ........ *G11C 16/102* (2013.01); *G11C 16/0483* (2013.01); *G11C 16/30* (2013.01)

(58) Field of Classification Search
CPC ................................................. G11C 16/0425
See application file for complete search history.

(56) References Cited

U.S. PATENT DOCUMENTS 5,455,792 A * 10/1995 Yi ........................ H10D 30/685 365/185.15
9,997,253 B1 * 6/2018 Chen .................. G11C 11/5628
2019/0206882 A1 * 7/2019 MacPeak .......... G11C 16/0408

FOREIGN PATENT DOCUMENTS

CN 103022041 A 4/2013
CN 114023364 A 2/2022
(Continued)

OTHER PUBLICATIONS

International Search Report of the ISA issued in PCT/CN2023/111900, mailed Oct. 24, 2023; ISA/CN.

*Primary Examiner* — Hoai V Ho
(74) *Attorney, Agent, or Firm* — Harness, Dickey & Pierce, P.L.C.

(57) ABSTRACT

A split-gate memory array and a method for operating same. The array comprises: a memory array including a plurality of memory cell groups, each memory cell group comprising a first memory cell and a second memory cell, wherein the first memory cell comprises a first storage transistor and a first selection transistor which are formed by means of a split-gate structure, and the second memory cell comprises a second storage transistors and a second selection transistors which are formed by means of a split-gate structure; gate electrodes of the first selection transistors in the same row are connected, gate electrodes of the second selection transistors in the same row are connected, the selection transistors and the storage transistors use a split-gate struc-
(Continued)

ture, and the gate electrodes of adjacent selection transistors are connected together to reduce the number of external connection holes, thereby reducing the area of the memory cells.

11 Claims, 12 Drawing Sheets

(56) References Cited

FOREIGN PATENT DOCUMENTS

| | | | |
|---|---|---|---|
| CN | 115482860 | A | 12/2022 |
| JP | 2003046002 | A | 2/2003 |
| KR | 20000019970 | A | 4/2000 |

* cited by examiner

SPLIT-GATE MEMORY ARRAY AND METHOD FOR OPERATING SAME

CROSS-REFERENCE TO RELATED APPLICATIONS

This application is the national phase of International Application No. PCT/CN2023/111900, filed on Aug. 9, 2023, which claims the benefit of priority to Chinese patent application No. 202310073534.6, filed on Jan. 16, 2023, entitled "SPLIT-GATE MEMORY ARRAY AND METHOD FOR OPERATING SAME", the entire disclosures of which are incorporated herein by reference.

TECHNICAL FIELD

The present disclosure generally relates to semiconductor manufacturing technology field, and more particularly to a split-gate memory array and a method for operating the split-gate memory array.

BACKGROUND

With a rapid popularization of electronic products, a flash memory as a mainstream storage carrier today has been rapidly promoted and popularized, and its technology has also developed rapidly. Non-volatile memory (NVM) technology can be divided into floating gate technology and SONOS (Silicon-Oxide-Nitride-Oxide-Silicon) technology based on a storage media. Structurally, NVM technology can be divided into single gate (1-Transistor) technology, split-gate (split gate) technology and dual gate (2-Transistor) technology, etc. Flash has been increasingly used in various embedded electronic products such as financial IC cards, automotive electronics, etc., due to its long lifespan, non-volatile nature, low price and ease of programming and erasing. Improving storage integration density is beneficial for saving chip area and reducing manufacturing costs.

Currently, with a development of mainstream process technology and an urgent demand for flash devices, a split-gate flash based on a split-gate structure has received widespread attention. Compared with a traditional flash, a split-gate Flash memory, as a flash memory, has gained more attention in both monolithic and embedded products due to its efficient programming speed and ability to completely avoid over-erasure. Currently, the split-gate flash memory has been widely used in personal computers, digital devices, mobile terminals, smart cards and other products. The split-gate flash performs excellently in terms of reliability and ability to avoid over-erasure, and due to its compact structure, more memory cells can be integrated in a same chip area, which can achieve a better optimization effect on capacity enhancement.

However, due to a significant increase in data volume in current information age, there is a need for further optimization of memory structures to achieve higher capacity in the semiconductor industry.

SUMMARY

Embodiments of the present disclosure provide a split-gate memory array and a method for operating the split-gate memory array, which can effectively reduce an area of a memory cell.

An embodiment of the present disclosure provides a split-gate memory array. The split-gate memory array includes a plurality of memory cell groups respectively distributed along a first direction and a second direction to form a memory array disposed in a same well region, wherein the first direction is perpendicular to the second direction. Each memory cell group includes a first memory cell and a second memory cell connected and arranged along the second direction, wherein the first memory cell includes a first storage transistor and a first selection transistor in a split-gate structure, and the second memory cell includes a second storage transistor and a second selection transistor in a split-gate structure, wherein the first selection transistor and the second selection transistor share a gate and are disposed between the first storage transistor and the second storage transistor, and the first selection transistor and the second selection transistor share a source so that the first memory cell and the second memory cell share a source. Along the first direction, gates of first storage transistors in a same row are connected with each other and connected with a memory gate word line WLSna, gates of second storage transistors in a same row are connected with each other and connected with a memory gate word line WLSnb, gates of first selection transistors in a same row are connected with each other, gates of second selection transistors in a same row are connected with each other, the gate of the first selection transistor and the gate of the second selection transistor in each memory cell group are connected with a selection gate word line WLn, and sources in the plurality of memory cell groups in a same row are connected with each other and connected with a source line SL. Along the second direction, drains of the first storage transistors in a same column are connected with each other and connected with a bit line BLna, and drains of the second storage transistors in a same column are connected with each other and connected with a bit line BLnb.

According to some embodiments, in each memory cell group, a channel of the first storage transistor and a channel of the second storage transistor are disposed along a horizontal direction, and a channel of the first selection transistor and a channel of the second selection transistor are disposed along a vertical direction.

According to some embodiments, the first storage transistor, the first selection transistor, the second storage transistor and the second selection transistor share the source in each memory cell group.

According to some embodiments, the first storage transistor includes a SONOS storage transistor, and the second storage transistor includes a SONOS storage transistor.

According to some embodiments, the first selection transistor is a MOS transistor device including a stacked gate oxide layer and a polysilicon gate layer, and the second selection transistor is a MOS transistor device including a stacked gate oxide layer and a polysilicon gate layer.

Another embodiment of the present disclosure provides a method for operating the split-gate memory array structure according to any one of preceding embodiments, wherein the memory array adopts a row operation mode when performing data erasing and writing to erase and write data simultaneously in target memory cells in a same row.

According to some embodiments, when performing data erasing in the memory array, a negative voltage Vneg is applied to the memory gate word line WLSna or the memory gate word line WLSnb corresponding to a row where a selected target memory cell is located, a positive voltage Vpos is applied to the memory gate word line WLSna and the memory gate word line WLSnb in an unselected memory cell in the memory array, and the positive voltage Vpos is applied to the selection gate word line WLn in the memory array. The source line SL in the memory array is set to a floating state, and the positive voltage Vpos is applied to the bit line BLna and the bit line BLnb in the memory array.

According to some embodiments, when performing data writing in the memory array, a positive voltage Vpos is applied to the memory gate word line WLSna corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state. When writing data "1" in the selected target memory cell, the negative voltage Vneg is applied to the bit line BLna corresponding to the selected target memory cell, and the negative voltage Vneg is applied to the bit line BLnb corresponding to the unselected memory cell. When writing data "0" in the selected target memory cell, a positive voltage Vp0 is applied to the bit line BLna corresponding to the selected target memory cell, and the negative voltage Vneg is applied to the bit line BLnb corresponding to the unselected memory cell.

According to some embodiments, when performing data writing in the memory array, a positive voltage Vpos is applied to the memory gate word line WLSnb corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state. When writing data "1" in the selected target memory cell, the negative voltage Vneg is applied to the bit line BLnb corresponding to the selected target memory cell, and the negative voltage Vneg is applied to the bit line BLna corresponding to the unselected memory cell. When writing data "0" in the selected target memory cell, a positive voltage Vp0 is applied to the bit line BLnb corresponding to the selected target memory cell, and the negative voltage Vneg is applied to the bit line BLna corresponding to the unselected memory cell.

According to some embodiments, when performing data reading in the memory array, a positive voltage Vpwr greater than a turn-on voltage of selection transistors is applied to the selection gate word line WLn corresponding to a selected target memory cell, a positive voltage Vpos1 is applied to the bit line BLna or the bit line BLnb corresponding to the selected target memory cell, and remaining ends in the memory array are grounded Vgnd.

According to some embodiments, when performing data erasing, writing and reading in the memory array, corresponding different voltages are applied to the well region.

According to some embodiments, when performing an erasing operation in a selected target memory cell, a positive voltage Vpos is applied to the well region, when performing a writing operation in the selected target memory cell, a negative voltage Vneg is applied to the well region, and when performing a reading operation in the selected target memory cell, the well region is grounded Vgnd.

Compared with conventional technology, the embodiments of the present disclosure have following advantages.

In the split-gate memory array of the present disclosure, the plurality of memory cell groups are respectively distributed along the first direction and the second direction to form the memory array disposed in the well region. Each memory cell group includes two groups of selection transistors and storage transistors formed in a split-gate structure. As the selection transistors and the storage transistors are formed in a split-gate structure, and the gates of adjacent selection transistors are connected with each other, the number of external holes can be reduced. At a same process node, the split-gate memory array can effectively reduce an area of the memory cells.

Furthermore, the memory cell group adopts a 3D structure, that is, a channel of the first storage transistor and a channel of the second storage transistor are disposed along a horizontal direction, and a channel of the first selection transistor and a channel of the second selection transistor are disposed along a vertical direction, which can reduce a horizontal area. The first selection transistor and the second selection transistor share a gate, which can reduce the number of external holes. Therefore, at the same process node, the memory cell group in a 3D structure can effectively reduce the area of the memory cells.

DETAILED DESCRIPTION

In order to make above objects, features and advantages of the present disclosure more obvious and understandable, specific embodiments of the present disclosure are described in detail below with reference to the accompanying drawings.

Figure 1:
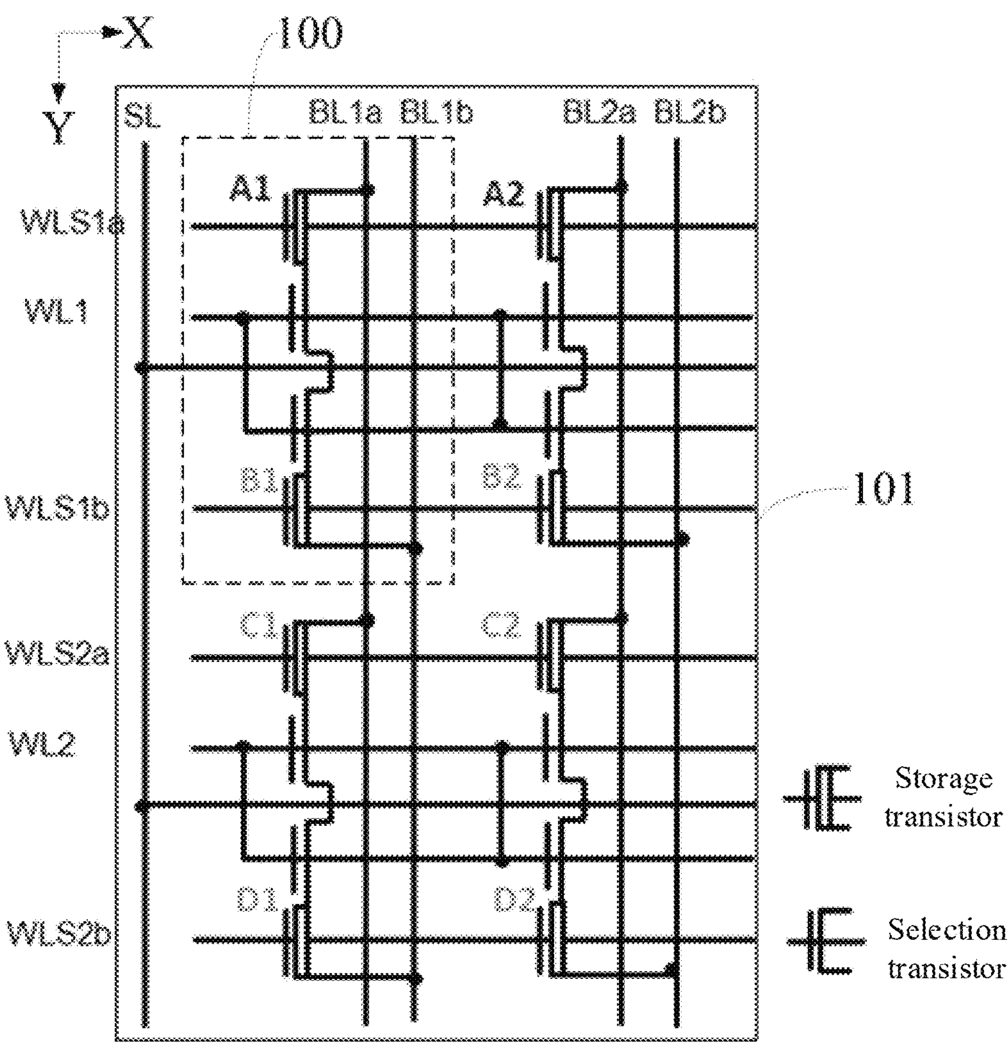
FIG. 1 illustrates a partial schematic structural view of a split-gate memory array according to an embodiment of the present disclosure.
Figure 2:
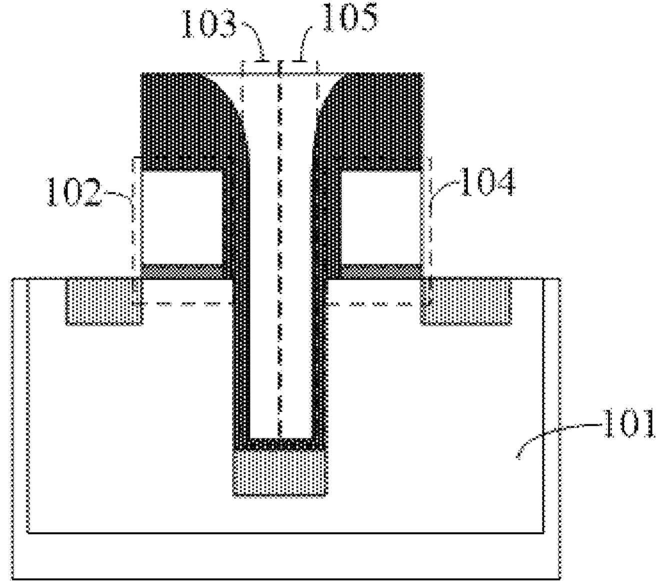
FIG. 2 illustrates a schematic structural view of a memory cell group in FIG. 1.

FIG. 1 illustrates a partial schematic structural view of a split-gate memory array according to an embodiment of the present disclosure, and FIG. 2 illustrates a schematic structural view of a memory cell group in FIG. 1.

Referring to FIGS. 1 and 2, a split-gate memory array includes a plurality of memory cell groups 100. The plurality of memory cell groups 100 are respectively distributed along a first direction X and a second direction Y to form a memory array disposed in a same well region 101. The first direction X is perpendicular to the second direction Y. Each memory cell group 100 includes a first memory cell A1 and a second memory cell B1 (or A2 and B2, or C1 and D1, or C2 and D2) connected and arranged along the second direction. The first memory cell A1 includes a first storage transistor 102 and a first selection transistor 103 in a split-gate structure, and the second memory cell B1 includes a second storage transistor 104 and a second selection transistor 105 in a split-gate structure. The first selection transistor 103 and the second selection transistor 105 are disposed between the first storage transistor 102 and the second storage transistor 104. The first selection transistor 103 and the second selection transistor 105 share a gate. That is to say, the gate of the first selection transistor 103 and the gate of the second selection transistor 105 are connected with each other. The first selection transistor 103 and the second selection transistor 105 share a source so that the first memory cell A1 and the second memory cell B1 share a source. Along the first direction X, gates of first storage transistors 102 in a same row are connected with each other and connected with a memory gate word line WLSna (WLS1a and WLS2a are shown in FIG. 1). The gates of second storage transistors 104 in a same row are connected with each other and connected with a memory gate word line WLSnb (WLS1b and WLS2b are shown in FIG. 1). The gates of first selection transistors 103 in a same row are connected with each other. The gates of second selection transistors 105 in a same row are connected with each other. The gates of the first selection transistors 103 and the gates of the second selection transistors 105 in each memory cell group are connected with each other and connected with a selection gate word line WLn (WL1 and WL2 are shown in FIG. 1). The sources in the plurality of memory cell groups 100 in a same row are connected with each other and connected with a source line SL. Along the second direction Y, drains of the first storage transistors 102 in a same column are connected with each other and connected with a bit line BLna (BL1a and BL2a are shown in FIG. 1), and drains of the second storage transistors 104 in a same column are connected with each other and connected with a bit line BLnb (BL1b and BL2b are shown in FIG. 1).

In some embodiments, the plurality of memory cell groups are respectively distributed along the first direction X and the second direction Y to form the memory array disposed in the well region. Each memory cell group 100 includes two groups of selection transistors and storage transistors formed in a split-gate structure. As the selection transistors and the storage transistors are formed in a split-gate structure, and the gates of adjacent selection transistors are connected with each other, the number of external holes can be reduced. At a same process node, the split-gate memory array can effectively reduce an area of the memory cells.

In some embodiments, the memory cell group 100 adopts a 3D structure, that is, a channel of the first storage transistor 102 and a channel of the second storage transistor 104 are disposed along a horizontal direction, and a channel of the first selection transistor 103 and a channel of the second selection transistor 105 are disposed along a vertical direction, which can reduce a horizontal area. The first selection transistor 103 and the second selection transistor 105 share a gate, which can reduce the number of external holes. Therefore, at the same process node, the memory cell group in a 3D structure can effectively reduce the area of the memory cells.

In some embodiments, the first storage transistor 102 is a SONOS storage transistor, and the second storage transistor 104 is a SONOS storage transistor.

In some embodiments, the first selection transistor 103 is a MOS transistor device including a stacked gate oxide layer and a polysilicon gate layer, and the second selection transistor 105 is a MOS transistor device including a stacked gate oxide layer and a polysilicon gate layer.

FIGS. 3 to 12 illustrate schematic views of local potentials of a method for operating the split-gate memory array when performing erasing, writing and reading operation according to an embodiment of the present disclosure.

Another embodiment of the present disclosure provides a method for operating the split-gate memory array structure according to any one of preceding embodiments. The memory array adopts a row operation mode when performing data erasing and writing to erase and write data simultaneously in target memory cells in a same row.

When performing data erasing in the memory array, a negative voltage Vneg is applied to the memory gate word line WLSna or the memory gate word line WLSnb corresponding to a row where a selected target memory cell is located, a positive voltage Vpos is applied to the memory gate word line WLSna and the memory gate word line WLSnb in an unselected memory cell in the memory array, and the positive voltage Vpos is applied to the selection gate word line WLn in the memory array. The source line SL in the memory array is set to a floating state, and the positive voltage Vpos is applied to the bit line BLna and the bit line BLnb in the memory array.

When performing data writing in the memory array, a positive voltage Vpos is applied to the memory gate word line WLSna corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state. When writing data "1" in the selected target memory cell, the negative voltage Vneg is applied to the bit line BLna corresponding to the selected target memory cell, and the negative voltage Vneg is applied to the bit line BLnb corresponding to the unselected memory cell. When writing data "0" in the selected target memory cell, a positive voltage Vp0 is applied to the bit line BLna corresponding to the selected target memory cell, and the negative voltage Vneg is applied to the bit line BLnb corresponding to the unselected memory cell.

When performing data writing in the memory array, a positive voltage Vpos is applied to the memory gate word line WLSnb corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state. When writing data "1" in the selected target memory cell, the negative voltage Vneg is applied to the bit line BLnb corresponding to the selected target memory cell, and the negative voltage Vneg is applied to the bit line BLna corresponding to the unselected memory cell. When writing data "0" in the selected target memory cell, a positive voltage Vp0 is applied to the bit line BLnb corresponding to the selected target memory cell, and the negative voltage Vneg is applied to the bit line BLna corresponding to the unselected memory cell.

When performing data reading in the memory array, a positive voltage Vpwr greater than a turn-on voltage of the selection transistors is applied to the selection gate word line WLn corresponding to a selected target memory cell, a positive voltage Vpos1 is applied to the bit line BLna or the bit line BLnb corresponding to the selected target memory cell, and remaining ends in the memory array are grounded Vgnd.

When performing data erasing, writing and reading in the memory array, corresponding different voltages are applied to the well region 101. When performing an erasing operation in a selected target memory cell, a positive voltage Vpos is applied to the well region 101. When performing a writing operation in the selected target memory cell, a negative voltage Vneg is applied to the well region 101. When performing a reading operation in the selected target memory cell, the well region 101 is grounded Vgnd.

In some specific embodiments, a table of voltages applied for data reading, erasing, and writing in the memory array is shown in Table 1.

TABLE 1

| | Cell | Vwl | Vwls | Vsl | Vbl | Vpw |
|---|---|---|---|---|---|---|
| Erase | Selected A1, A2 | Vpos | Vneg | Float | Vpos | Vpos |
| | Unselected B1~D2 | Vpos | Vpos | | Vpos | |
| Program | Selected A1, A2 | Vneg | Vpos | Float | Vneg/Vp0 | Vneg |
| | Unselected B1~D2 | Vneg | Vneg | | Vneg/Vp0 | |
| Read | Selected A1 | Vpwr | Vgnd | Vgnd | Vpos1 | Vgnd |
| | A2, B1, B2 | Vpwr | Vgnd | | Vgnd | |
| | C1 | Vgnd | Vgnd | | Vpos1 | |
| | C2, D1, D2 | Vgnd | Vgnd | | Vgnd | |

As shown in Table 1, "Erase" represents performing data erasing in the memory cell, "Program" represents performing data writing in the memory cell, "Read" represents performing data reading in the memory cell, "Vwl" represents a value of the voltage applied to the selection gate word line WLn in the memory cell, "Vwls" represents a value of the voltage applied to the memory gate word line WLSna or the memory gate word line WLSnb in the memory cell, "Vbl" represents a value of the voltage applied to the bit line BLna or the bit line BLnb in the memory cell, "Vsl" represents a value of the voltage applied to the source line SL in the memory cell, and "Vpw" represents a value of the voltage applied to the well region in the memory cell.

Figure 3:
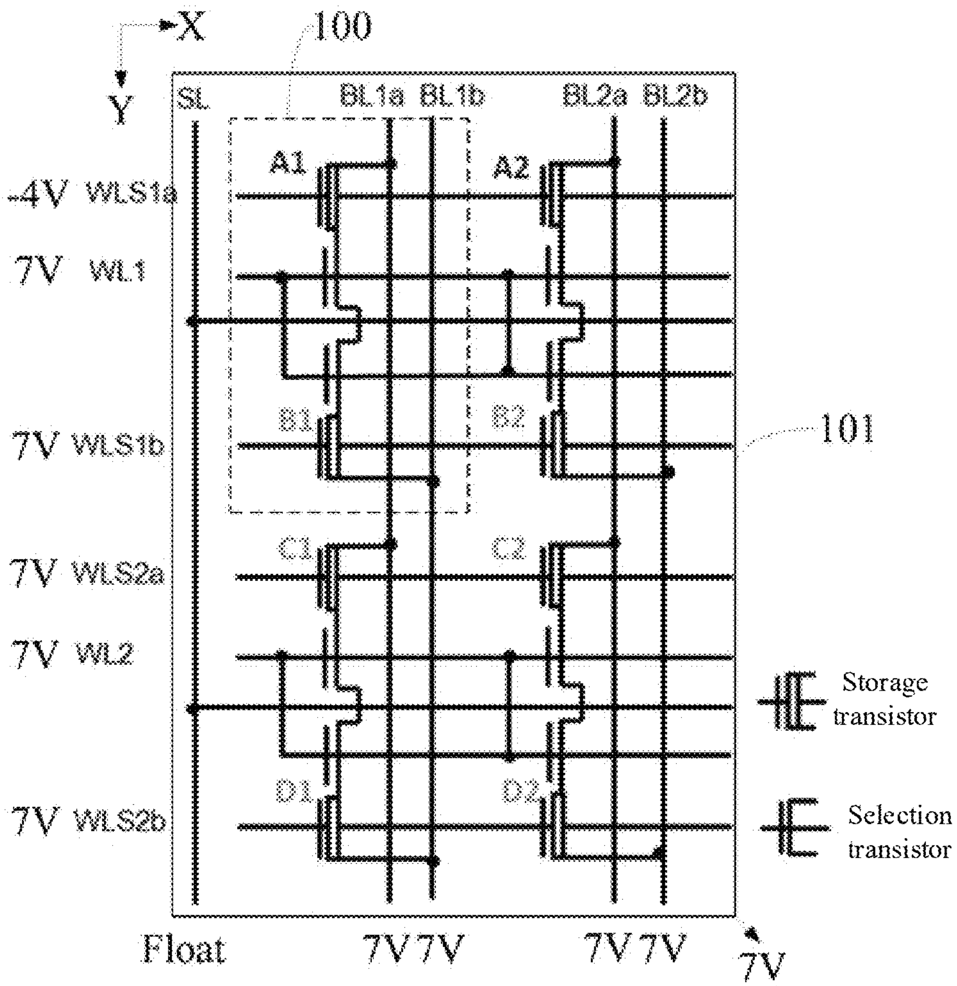
FIGS. 3 to 12 illustrate schematic views of local potentials of a method for operating the split-gate memory array when performing erasing, writing and reading operation according to an embodiment of the present disclosure.
Figure 4:
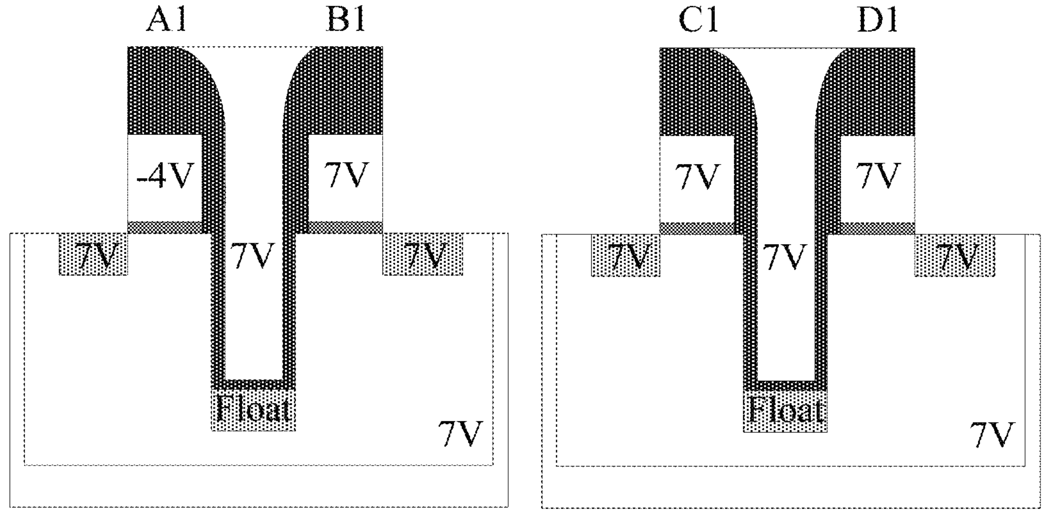

Referring to Table 1 and FIGS. 3 and 4, in a specific embodiment, when performing data erasing in the memory array, the negative voltage Vneg is applied to the memory gate word line WLS1a corresponding to the row where selected first memory cells A1 and A2 are located, and the positive voltage Vpos is applied to the memory gate word lines WLS1a and WLS2a and the memory gate word lines WLS1b and WLS2b corresponding to the rows where unselected first memory cells and unselected second memory cells B1 to D2 are located in the memory array. The positive voltage Vpos is applied to all selection gate word lines WL1 and WL2 in the memory array, and the source line SL in the memory array is set to a floating state. The positive voltage Vpos is applied to all bit lines BL1a and BL2a and all bit lines BL1b and BL2b in the memory array, and the positive voltage Vpos is applied to the well region 101.

Figure 5:
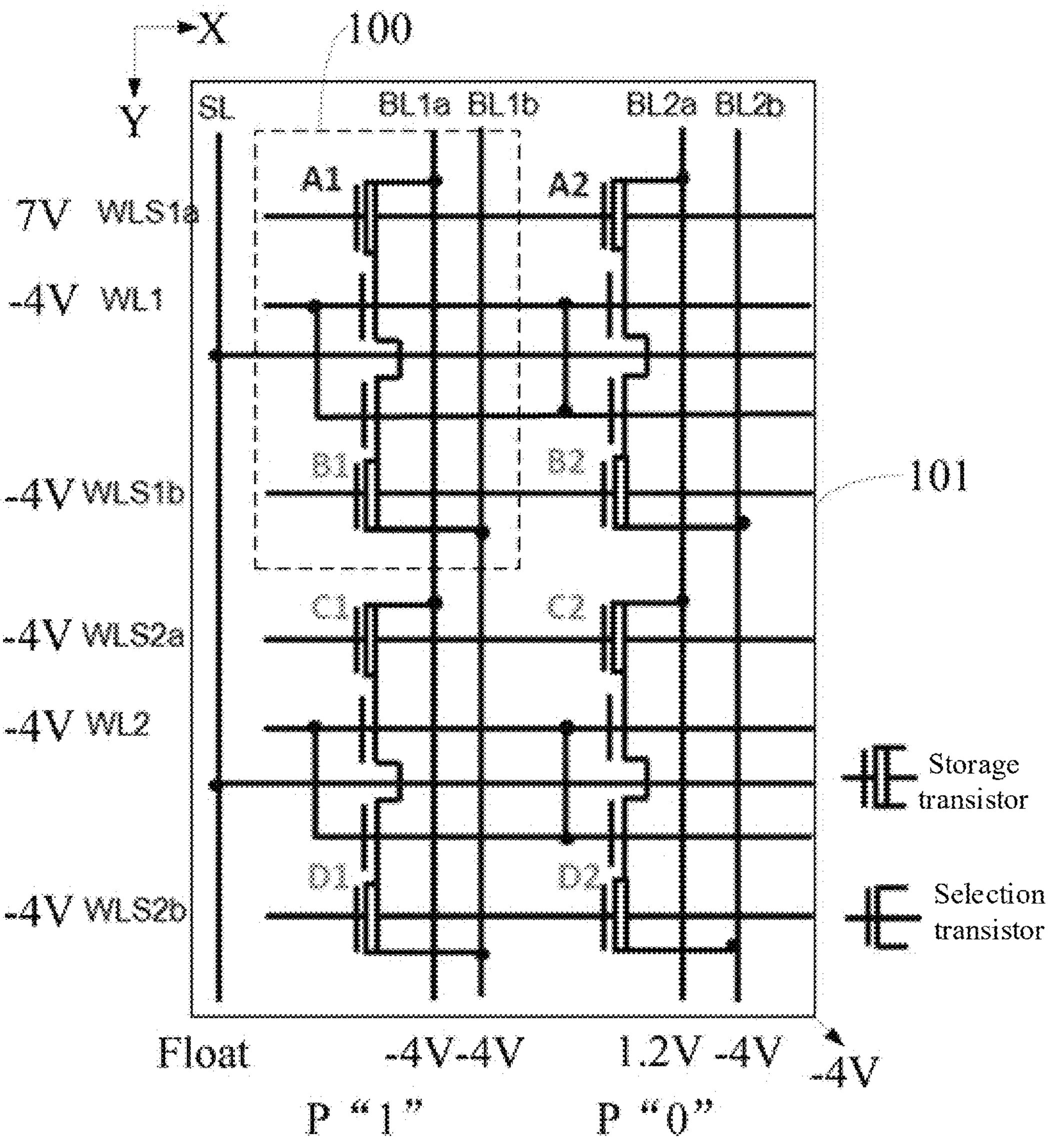
Figure 6:
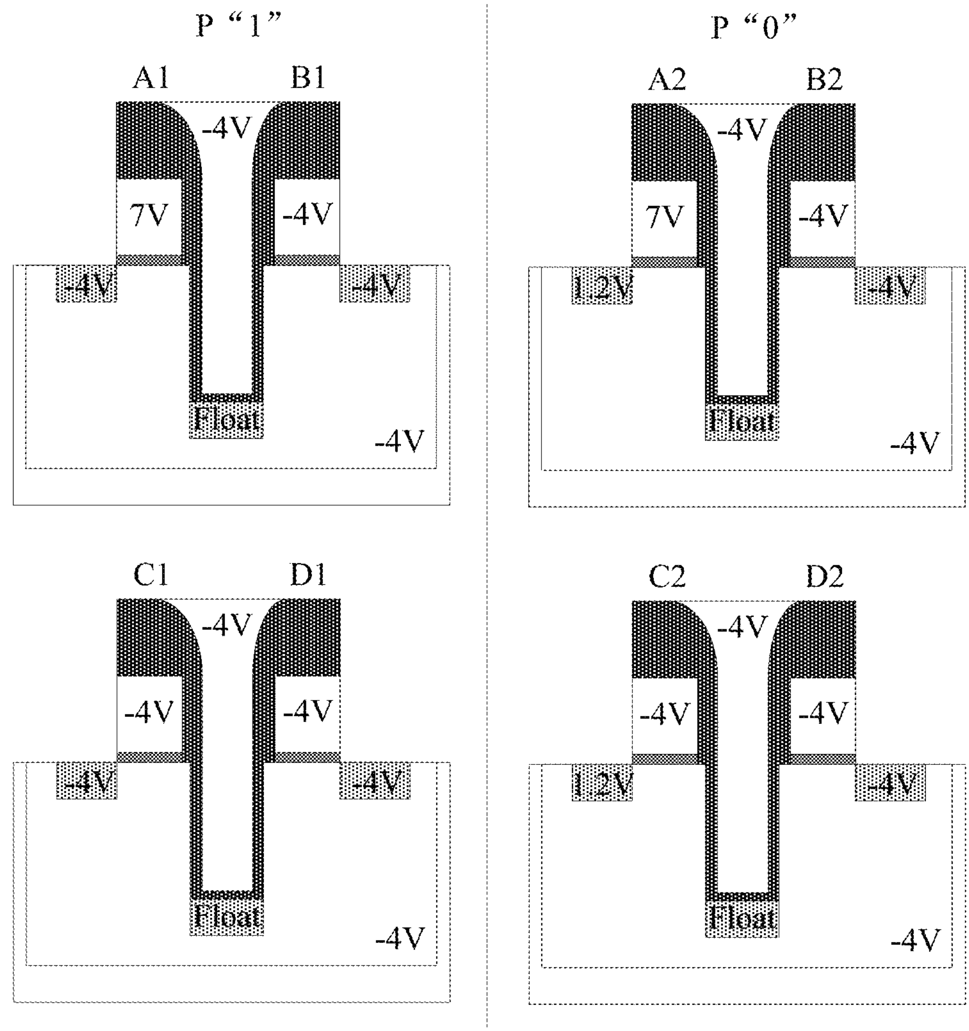

Referring to Table 1 and FIGS. 5 and 6, in a specific embodiment, when performing data writing in the memory array, the positive voltage Vpos is applied to the memory gate word line WLS1a corresponding to the row where the selected first memory cells A1 and A2 are located, and the negative voltage Vneg is applied to the memory gate word lines WLS1a and WLS2a and the memory gate word lines WLS1b and WLS2b corresponding to the rows where the unselected first memory cells C1 and C2 and the unselected second memory cells B1, B2, D1, and D2 are located in the memory array. The negative voltage Vneg is applied to all selection gate word lines WL1 and WL2 in the memory array, and the source line SL in the memory array is set to the floating state. When writing data "1" in the selected first memory cell A1, the negative voltage Vneg is applied to the bit line BL1a corresponding to the selected first memory cell A1, and the negative voltage Vneg is applied to the bit line BL1b corresponding to the unselected second memory cell B1. When writing data "0" in the selected first memory cell A2, the positive voltage Vp0 is applied to the bit line BL2a corresponding to the selected first memory cell A2, the negative voltage Vneg is applied to the bit line BL2b corresponding to the unselected second memory cell B2, and the negative voltage Vneg is applied to the well region 101.

Figure 7:
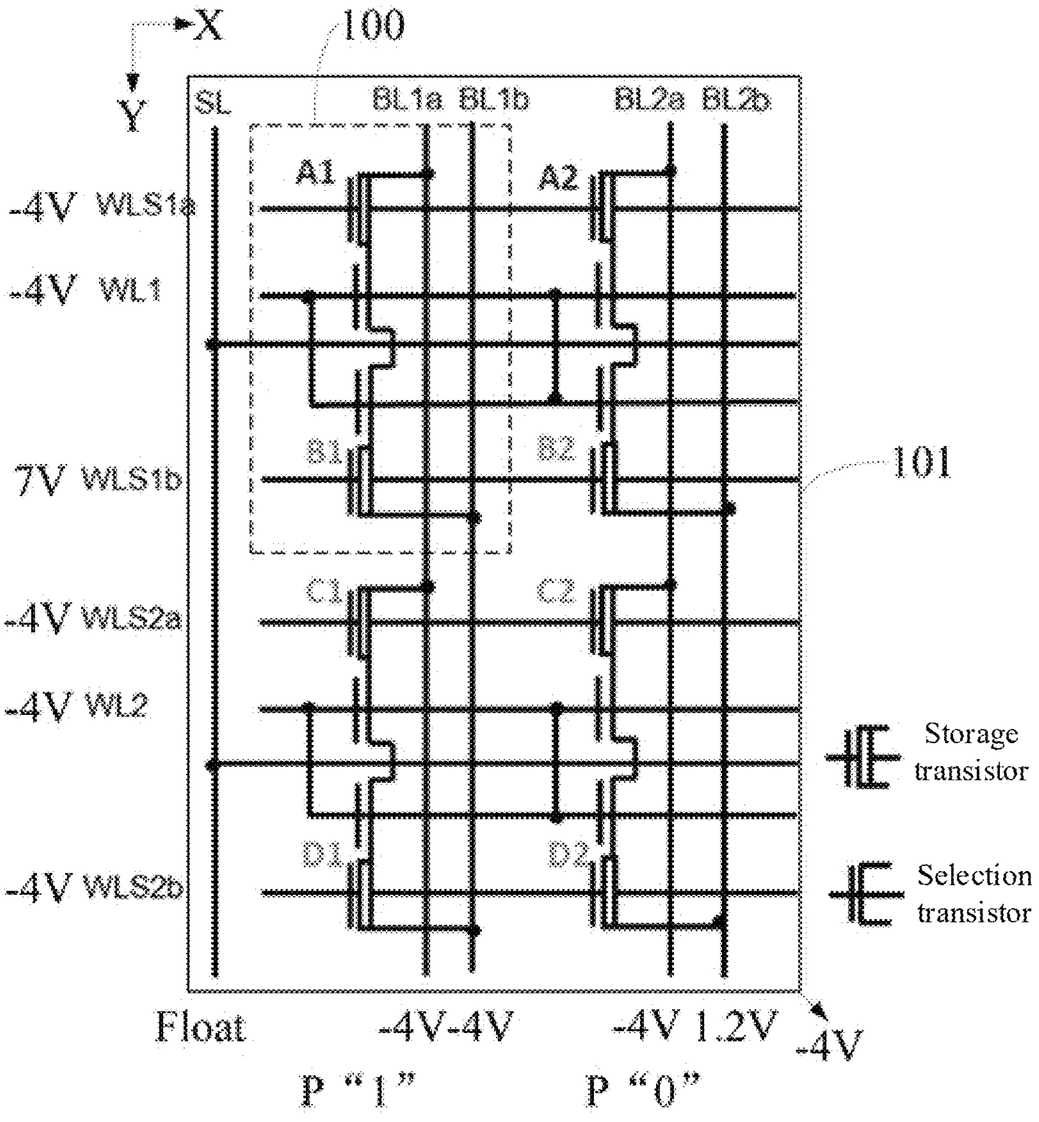
Figure 8:
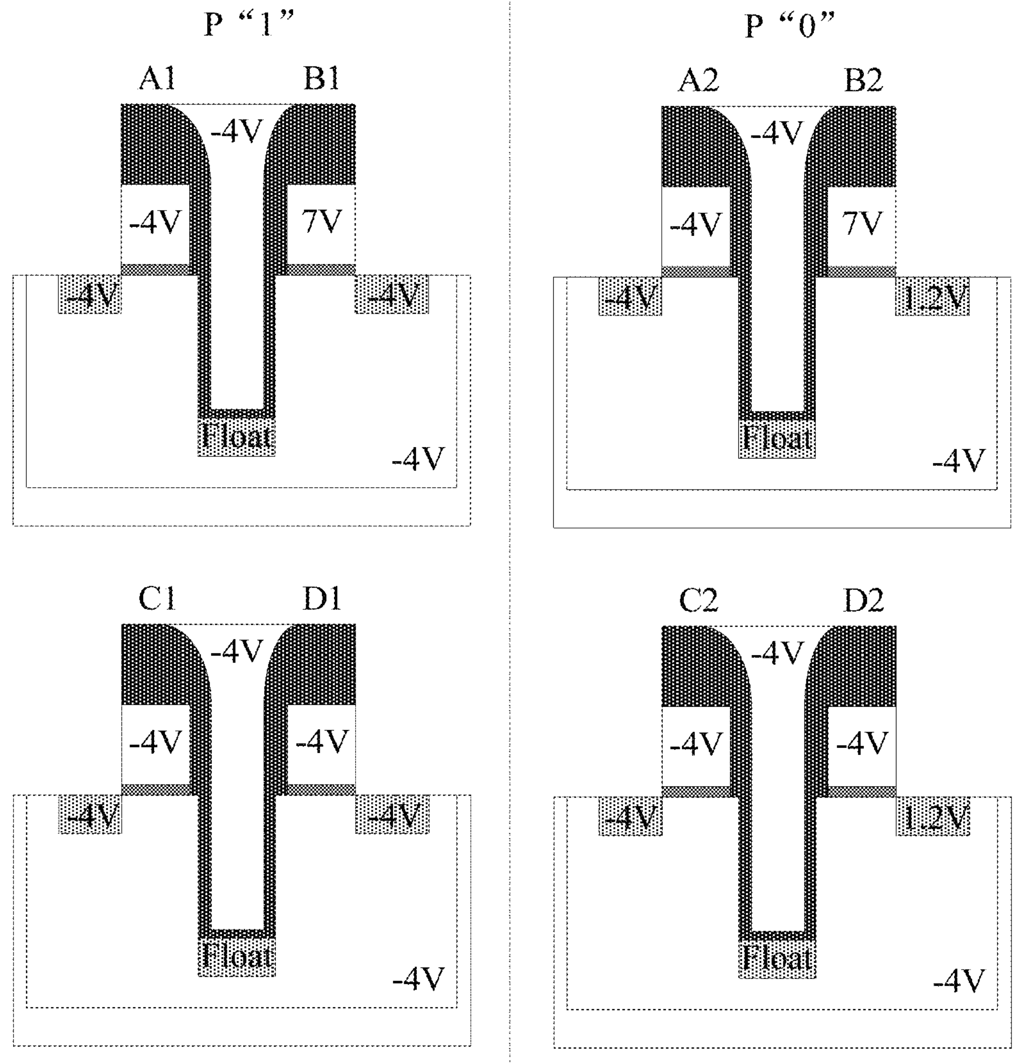

Referring to Table 1 and FIGS. 7 and 8, in a specific embodiment, when performing data writing in the memory array, the positive voltage Vpos is applied to the memory gate word line WLS1b corresponding to the row where the selected second memory cells B1 and B2 are located, and the negative voltage Vneg is applied to the memory gate word lines WLS1a and WLS2a and the memory gate word lines WLS1b and WLS2b corresponding to the rows where the unselected first memory cells A1, A2, C1, C2 and the unselected second memory cells D1, D2 are located in the memory array. The negative voltage Vneg is applied to all selection gate word lines WL1 and WL2 in the memory array, and the source line SL in the memory array is set to the floating state. When writing data "1" in the selected second memory cell B1, the negative voltage Vneg is applied to the bit line BL1b corresponding to the selected second memory cell B1, and the negative voltage Vneg is applied to the bit line BL1a corresponding to the unselected first memory cell A1. When writing data "0" in the selected second memory cell B2, the positive voltage Vp0 is applied to the bit line BL2b corresponding to the selected second memory cell B2, the negative voltage Vneg is applied to the bit line BL2a corresponding to the unselected first memory cell A2, and the negative voltage Vneg is applied to the well region 101.

Figure 9:
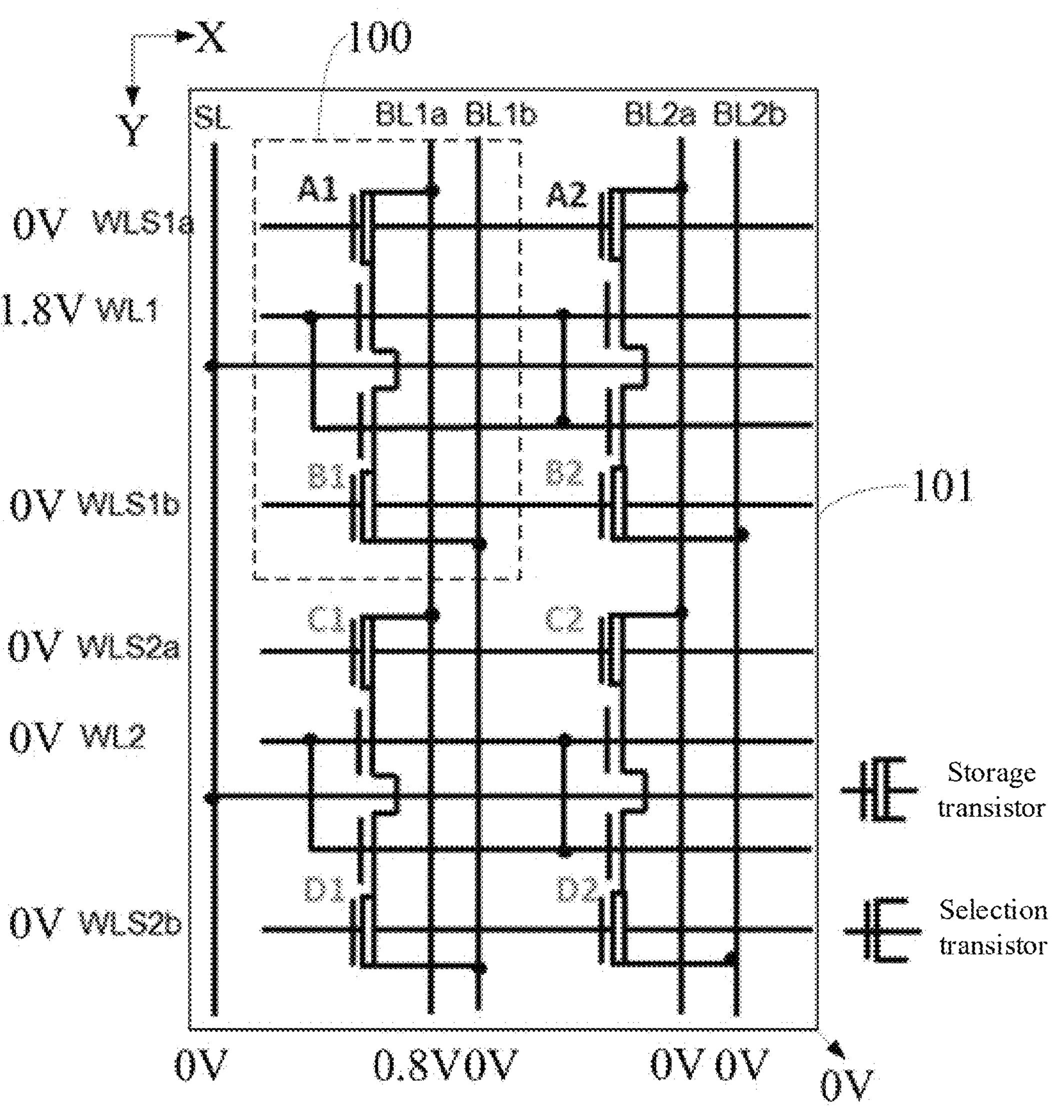
Figure 10:
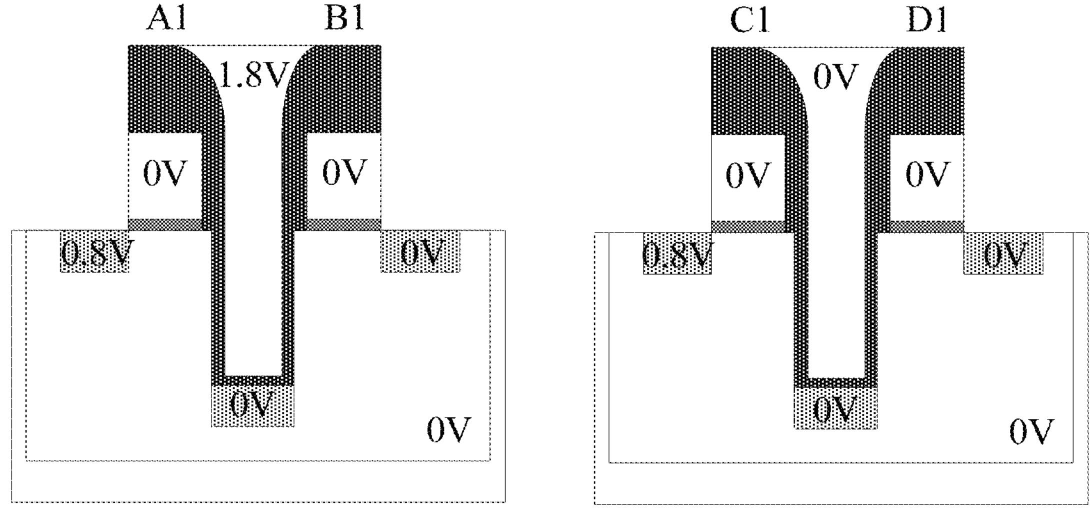

Referring to Table 1 and FIGS. 9 and 10, in a specific embodiment, when performing data reading in the memory array, the positive voltage Vpwr greater than a turn-on voltage of the first selection transistor 103 is applied to the selection gate word line WL1 corresponding to the selected first memory cell A1, the positive voltage Vpos1 is applied to the bit line BL1a corresponding to the selected first memory cell A1, and other ends in the memory array are grounded Vgnd.

Figure 11:
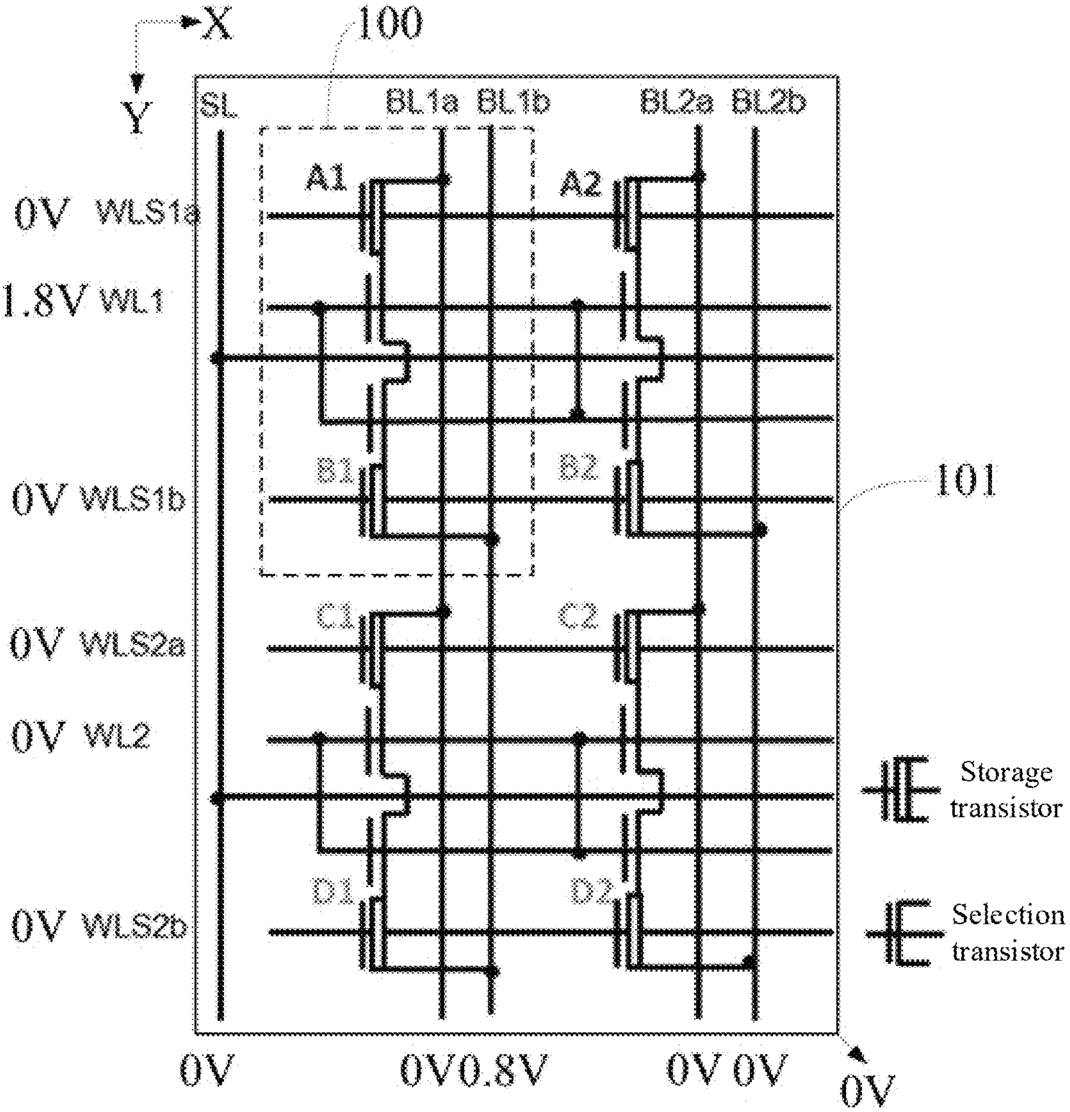
Figure 12:
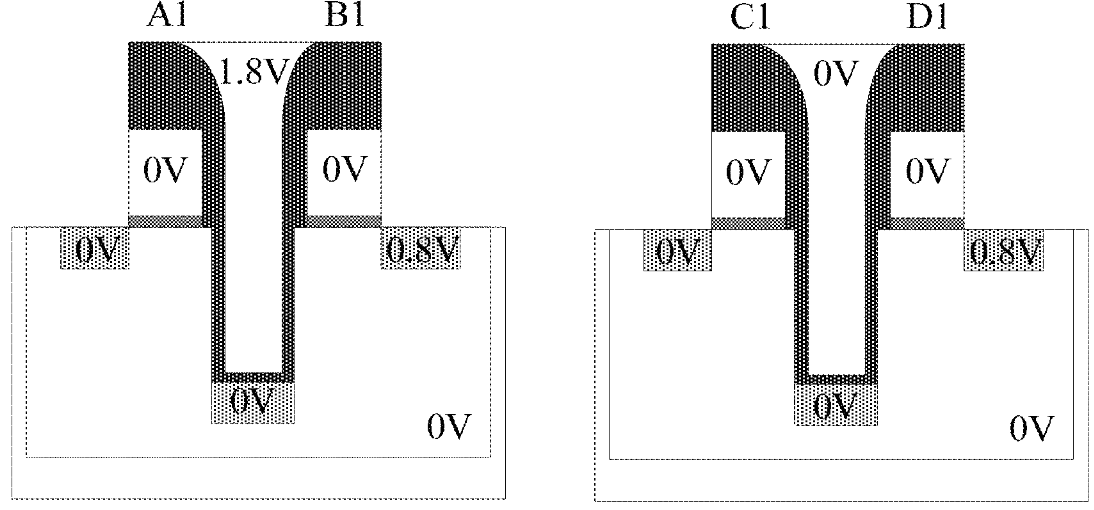

Referring to Table 1 and FIGS. 11 and 12, in a specific embodiment, when performing data reading in the memory array, the positive voltage Vpwr greater than the turn-on voltage of the first selection transistor 103 is applied to the selection gate word line WL1 corresponding to the selected second memory cell B1, the positive voltage Vpos1 is applied to the bit line BL1a corresponding to the selected second memory cell B1, and other ends in the memory array are grounded Vgnd.

It should be noted that in some embodiments, the relationship between Vneg, Vpos1, Vgnd, Vp0, Vpwr and Vpos can be Vneg<Vgnd=OV<Vpos1<Vp0<Vpwr<Vpos. Specifically, specific values of Vneg, Vpos1, Vp0, Vpwr and Vpos are only shown as examples in the embodiments of the present disclosure. For example, Vneg=−4V, Vpos1=0.8V, Vp0=1.2V, Vpwr=1.8V, and Vpos=7V. In other embodiments, different voltage values can be set according to the actual situation, and the present disclosure does not limit thereto.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A split-gate memory array, comprising:

a plurality of memory cell group respectively distributed along a first direction and a second direction to form a memory array disposed in a same well region, wherein the first direction is perpendicular to the second direction;

wherein each memory cell group comprises a first memory cell and a second memory cell connected and arranged along the second direction, wherein the first memory cell comprises a first storage transistor and a first selection transistor in a split-gate structure, and the second memory cell comprises a second storage transistor and a second selection transistor in a split-gate structure, wherein the first selection transistor and the second selection transistor share a gate and are disposed between the first storage transistor and the second storage transistor, and the first selection transistor and the second selection transistor share a source so that the first memory cell and the second memory cell share a source;

wherein along the first direction, gates of first storage transistors in a same row are connected with each other and connected with a memory gate word line WLSna, gates of second storage transistors in a same row are connected with each other and connected with a memory gate word line WLSnb, gates of first selection transistors in a same row are connected with each other, gates of second selection transistors in a same row are connected with each other, the gates of the first selection transistors and the gates of the second selection transistors in each memory cell group are connected with a selection gate word line WLn, and sources in the plurality of memory cell groups in a same row are connected with each other and connected with a source line SL; and wherein along the second direction, drains of the first storage transistors in a same column are connected with each other and connected with a bit line BLna, and drains of the second storage transistors in a same column are connected with each other and connected with a bit line BLnb.

2. The split-gate memory array according to claim 1, wherein in each memory cell group, a channel of the first storage transistor and a channel of the second storage transistor are disposed along a horizontal direction, and a channel of the first selection transistor and a channel of the second selection transistor are disposed along a vertical direction.

3. The split-gate memory array according to claim 1, wherein the first storage transistor comprises a SONOS storage transistor, and the second storage transistor comprises a SONOS storage transistor.

4. The split-gate memory array according to claim 1, wherein the first selection transistor is a MOS transistor device comprising a stacked gate oxide layer and a polysilicon gate layer, and the second selection transistor is a MOS transistor device comprising a stacked gate oxide layer and a polysilicon gate layer.

5. A method for operating a split-gate memory array structure according to claim 1, wherein the memory array adopts a row operation mode when performing data erasing and writing to erase and write data simultaneously in target memory cells in a same row.

6. The method according to claim 5, wherein when performing data erasing in the memory array, a negative voltage Vneg is applied to the memory gate word line WLSna or the memory gate word line WLSnb corresponding to a row where a selected target memory cell is located, a positive voltage Vpos is applied to the memory gate word line WLSna and the memory gate word line WLSnb in an unselected memory cell in the memory array, and the positive voltage Vpos is applied to the selection gate word line WLn in the memory array; and wherein the source line SL in the memory array is set to a floating state, and the positive voltage Vpos is applied to the bit line BLna and the bit line BLnb in the memory array.

7. The method according to claim 5, wherein when performing data writing in the memory array, a positive voltage Vpos is applied to the memory gate word line WLSna corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state;

wherein when writing data "1" in the selected target memory cell, the negative voltage Vneg is applied to the bit line BLna corresponding to the selected target memory cell, and the negative voltage Vneg is applied to the bit line BLnb corresponding to the unselected memory cell; and wherein when writing data "0" in the selected target memory cell, a positive voltage Vp0 is applied to the bit line BLna corresponding to the selected target memory cell, and the negative voltage Vneg is applied to the bit line BLnb corresponding to the unselected memory cell.

8. The method according to claim 5, wherein when performing data writing in the memory array, a positive voltage Vpos is applied to the memory gate word line WLSnb corresponding to a row where a selected target memory cell is located, a negative voltage Vneg is applied to the memory gate word line WLSna and the memory gate word line WLSnb in an unselected memory cell in the memory array, and the negative voltage Vneg is applied to the selection gate word line WLn in the memory array, and the source line SL in the memory array is set to a floating state;

wherein when writing data "1" in the selected target memory cell, the negative voltage Vneg is applied to the bit line BLnb corresponding to the selected target memory cell, and the negative voltage Vneg is applied to the bit line BLna corresponding to the unselected memory cell; and wherein when writing data "0" in the selected target memory cell, a positive voltage Vp0 is applied to the bit line BLnb corresponding to the selected target memory cell, and the negative voltage Vneg is applied to the bit line BLna corresponding to the unselected memory cell.

9. The method according to claim 5, wherein when performing data reading in the memory array, a positive voltage Vpwr greater than a turn-on voltage of selection transistors is applied to the selection gate word line WLn corresponding to a selected target memory cell, a positive voltage Vpos1 is applied to the bit line BLna or the bit line BLnb corresponding to the selected target memory cell, and remaining ends in the memory array are grounded Vgnd.

10. The method according to claim 5, wherein when performing data erasing, writing and reading in the memory array, corresponding different voltages are applied to the well region.

11. The method according to claim 10, wherein when performing an erasing operation in a selected target memory cell, a positive voltage Vpos is applied to the well region, when performing a writing operation in the selected target memory cell, a negative voltage Vneg is applied to the well region, and when performing a reading operation in the selected target memory cell, the well region is grounded Vgnd.

* * * * *